(12) United States Patent
Wu et al.

(10) Patent No.: US 9,414,502 B2
(45) Date of Patent: Aug. 9, 2016

(54) FLAT CABLE ASSEMBLY AND METHOD OF ASSEMBLING THE SAME

(71) Applicant: FOXCONN INTERCONNECT TECHNOLOGY LIMITED, Grand Cayman (KY)

(72) Inventors: Jerry Wu, Irvine, CA (US); Jun Chen, Kunshan (CN); Fan-Bo Meng, Kunshan (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 14/511,163

(22) Filed: Oct. 9, 2014

(65) Prior Publication Data

US 2015/0101855 A1    Apr. 16, 2015

(30) Foreign Application Priority Data

Oct. 10, 2013    (CN) .......................... 2013 1 0469067

(51) Int. Cl.
| | |
|---|---|
| H05K 1/11 | (2006.01) |
| H05K 1/14 | (2006.01) |
| H01B 7/04 | (2006.01) |
| H05K 3/36 | (2006.01) |
| H05K 3/34 | (2006.01) |
| H01R 12/79 | (2011.01) |
| H05K 1/18 | (2006.01) |
| H05K 3/30 | (2006.01) |
| H05K 1/02 | (2006.01) |

(52) U.S. Cl.
CPC ................ *H05K 3/341* (2013.01); *H01R 12/79* (2013.01); *H05K 1/111* (2013.01); *H05K 1/14* (2013.01); *H05K 3/36* (2013.01); *H05K 1/0216* (2013.01); *H05K 1/18* (2013.01); *H05K 3/301* (2013.01); *H05K 2201/10356* (2013.01); *Y02P 70/611* (2015.11); *Y10T 29/49179* (2015.01)

(58) Field of Classification Search
CPC ........ H01B 7/0861; H01B 7/04; H05K 1/111; H05K 1/0213; H05K 3/341; H05K 1/189; H05K 1/0393; H05K 1/0283; H05K 1/0281; H05K 1/11; H05K 1/118; H05K 1/14; H05K 1/147; H05K 3/36; H05K 1/361; H05K 1/363; H05K 2201/05; H01R 12/79; Y10T 29/49179
USPC .................. 174/250–268, 117 F, 172 R, 72 A
See application file for complete search history.

(56) References Cited

U.S. PATENT DOCUMENTS

| 4,644,092 | A | * | 2/1987 | Gentry | ................. | H01B 7/0838 |
|---|---|---|---|---|---|---|
| | | | | | | 174/102 C |
| 6,559,377 | B1 | * | 5/2003 | Noda | ................... | H01B 7/0861 |
| | | | | | | 174/117 F |

(Continued)

FOREIGN PATENT DOCUMENTS

| CN | 202111932 U | 1/2012 |
|---|---|---|
| CN | 202111933 U | 1/2012 |

*Primary Examiner* — Ishwarbhai B Patel
(74) *Attorney, Agent, or Firm* — Wei Te Chung; Ming Chieh Chang

(57) ABSTRACT

A flat cable assembly includes a flat cable; a PCB electrically connected to the flat cable; and a retainer formed on the joint of the flat cable and the PCB. The flat cable defines a metallic shielding layer having extension portions formed at two sides of the flat cable, the PCB defines grounding conductive pads electrically connected to the extension portion.

13 Claims, 5 Drawing Sheets

(56) References Cited

U.S. PATENT DOCUMENTS 6,950,314 B2 * 9/2005 Reznik ................. H01R 12/62
174/254

2009/0277664 A1 * 11/2009 Yeh ..................... H01B 7/0838
174/113 R
2012/0181060 A1 * 7/2012 Chen ..................... H05K 1/024
174/117 F

* cited by examiner

FLAT CABLE ASSEMBLY AND METHOD OF ASSEMBLING THE SAME

BACKGROUND OF THE INVENTION

1. Field of the Invention

The present invention relates to a flat cable assembly, and more particularly to a flat cable assembly including a flat cable and a PCB welded to the flat cable, and a method of manufacturing the same.

2. Description of the Related Art

China Patent issue No. 202111933U issued on Jan. 11, 2012, discloses a flexible flat cable assembly. The flexible flat cable assembly includes a flexible flat cable, a PCB and an adhesive. The flexible flat cable is welded to the PCB. The adhesive is covered to the flexible flat cable and combined with the PCB. Thus, the flexible flat cable is engaged with and electrically connected to the PCB. There are a number of holes formed on the PCB and several parts of the adhesive are seeped into the holes to make the flexible flat cable positioned on the PCB reliable. However the electromagnetic interference of the flexible flat cable remain exists and influence the signal transmission quality of the flexible flat cable. On another aspect, when the flexible flat cable is welded to the PCB, the gold fingers of the flexible flat cable will be broke off easily.

An improved electrical connector assembly overcoming shortages of existing technology is needed.

SUMMARY OF THE INVENTION

Accordingly, an object of the present invention is to provide a flat cable assembly with improved anti-EMI function and method of assembling the same.

In order to achieve the object set forth, a flat cable assembly comprises: a flat cable; a PCB electrically connected to the flat cable; and a retainer formed on a joint of the flat cable and the PCB. The flat cable defines metallic shielding layer having extension portions formed on two sides of the flat cable, the PCB defines grounding conductive pads electrically connected to the extension portion.

In order to achieve the object set forth, a method of assembling the flat cable assembly comprises the following steps: firstly, welding the extension portions of the metal shield layer to the grounding conductive pads of the PCB; secondly, welding the number of conductors of the flat cable to the PCB; thirdly, covering the hot melt adhesive to the joint of the conductors and conductive pads and the joint of the extension portions and the grounding conductive pads of the PCB.

Other objects, features and advantages of the invention will be apparent from the following detailed description taken in connection with the accompanying drawings.

DESCRIPTION OF PREFERRED EMBODIMENT

Reference will now be made to the drawings to describe the present invention in detail.

Figure 1:
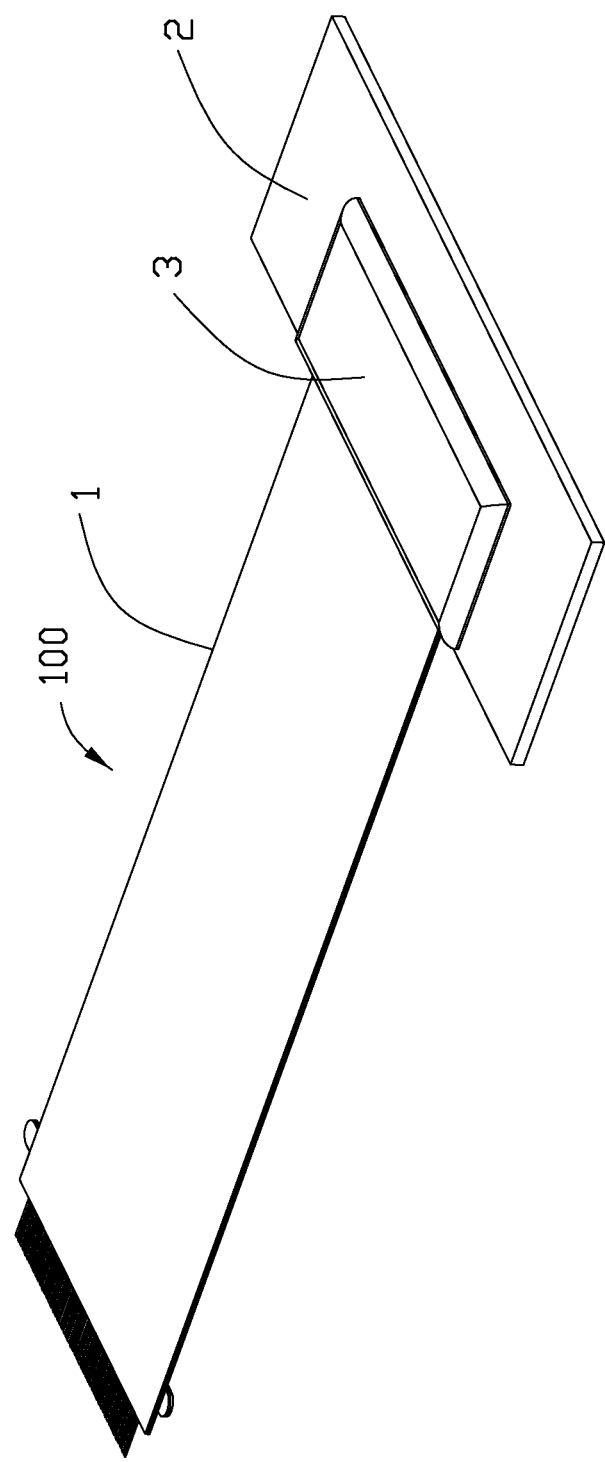
FIG. 1 is an assembled, perspective view of a flat cable assembly in accordance with the present invention.
Figure 2:
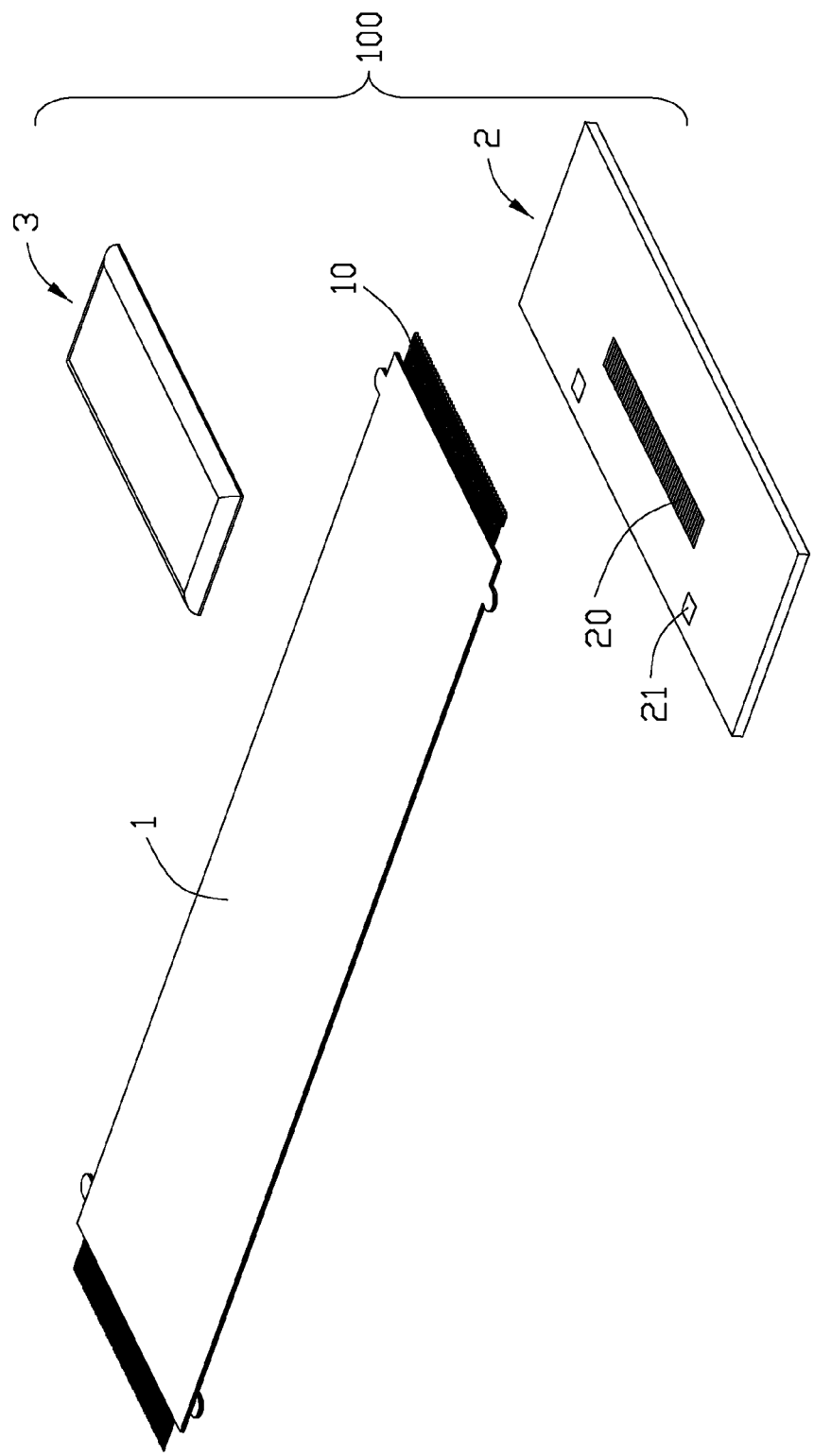
FIG. 2 is a partially exploded, perspective view of the flat cable assembly as shown in FIG. 1.
Figure 3:
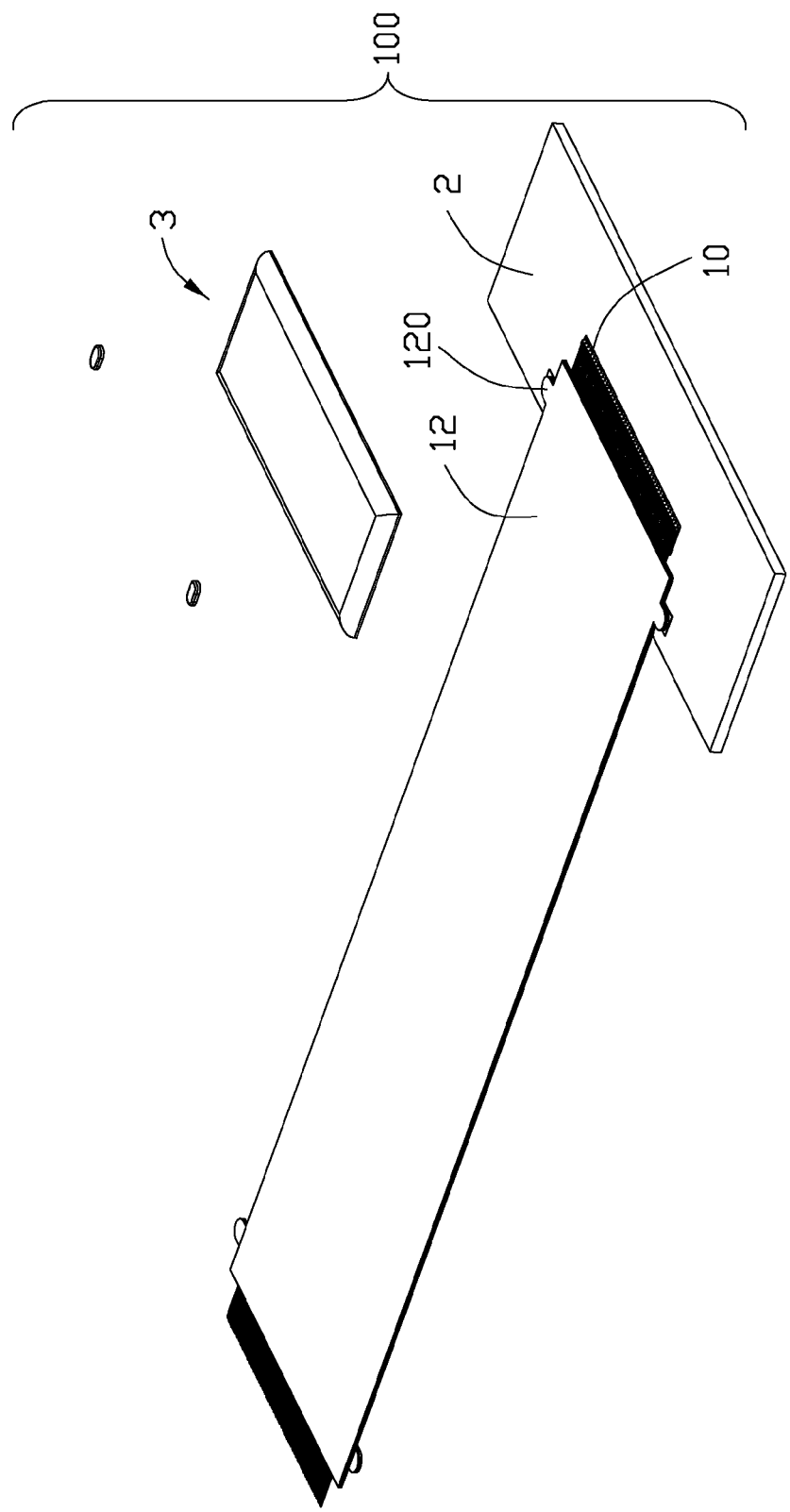
FIG. 3 is a partially assembled, perspective view of the flat cable assembly as shown in FIG. 1.
Figure 4:
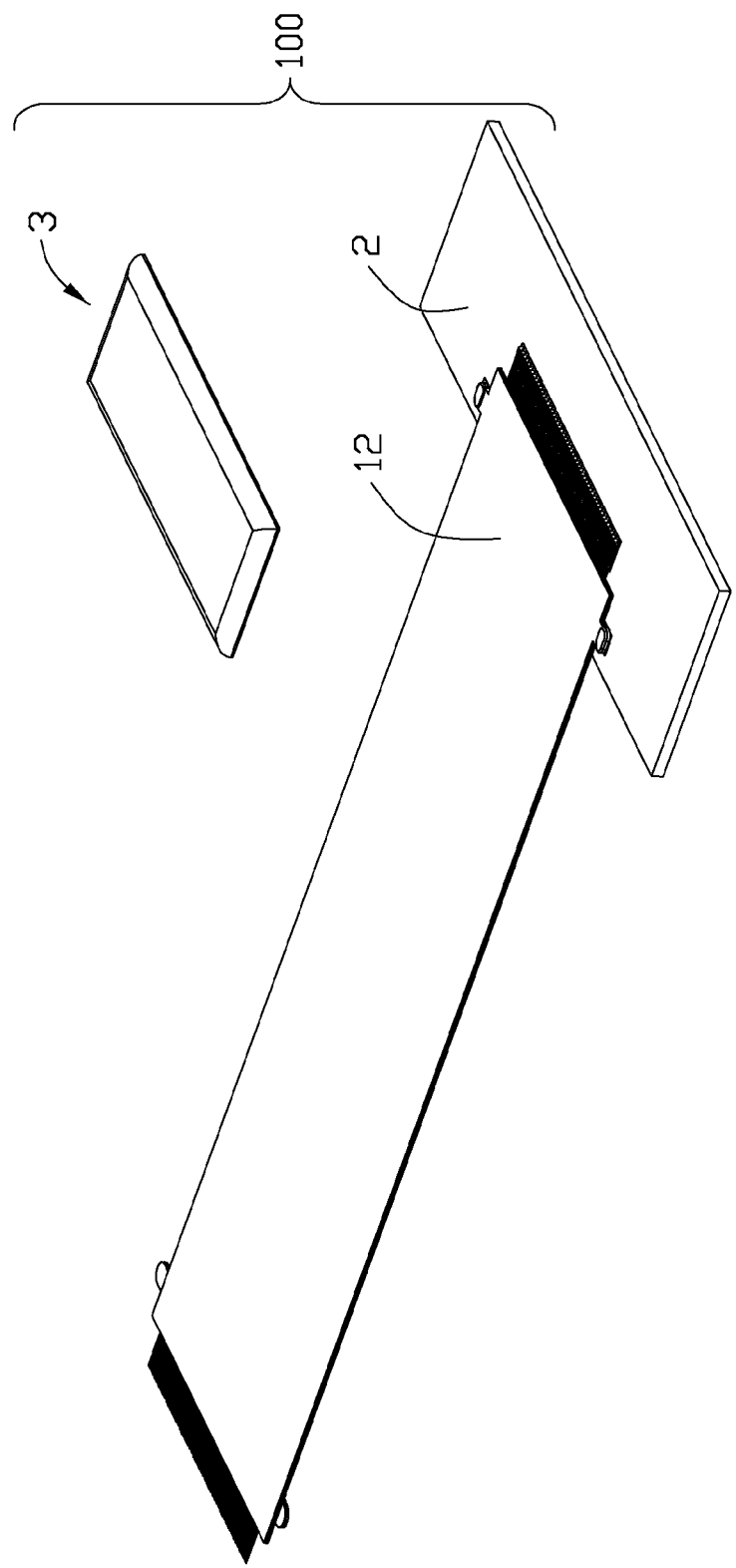
FIG. 4 is a schematic diagram that shows two extension portions of the metallic shielding layer welded to the grounding conductive pads of the PCB.
Figure 5:
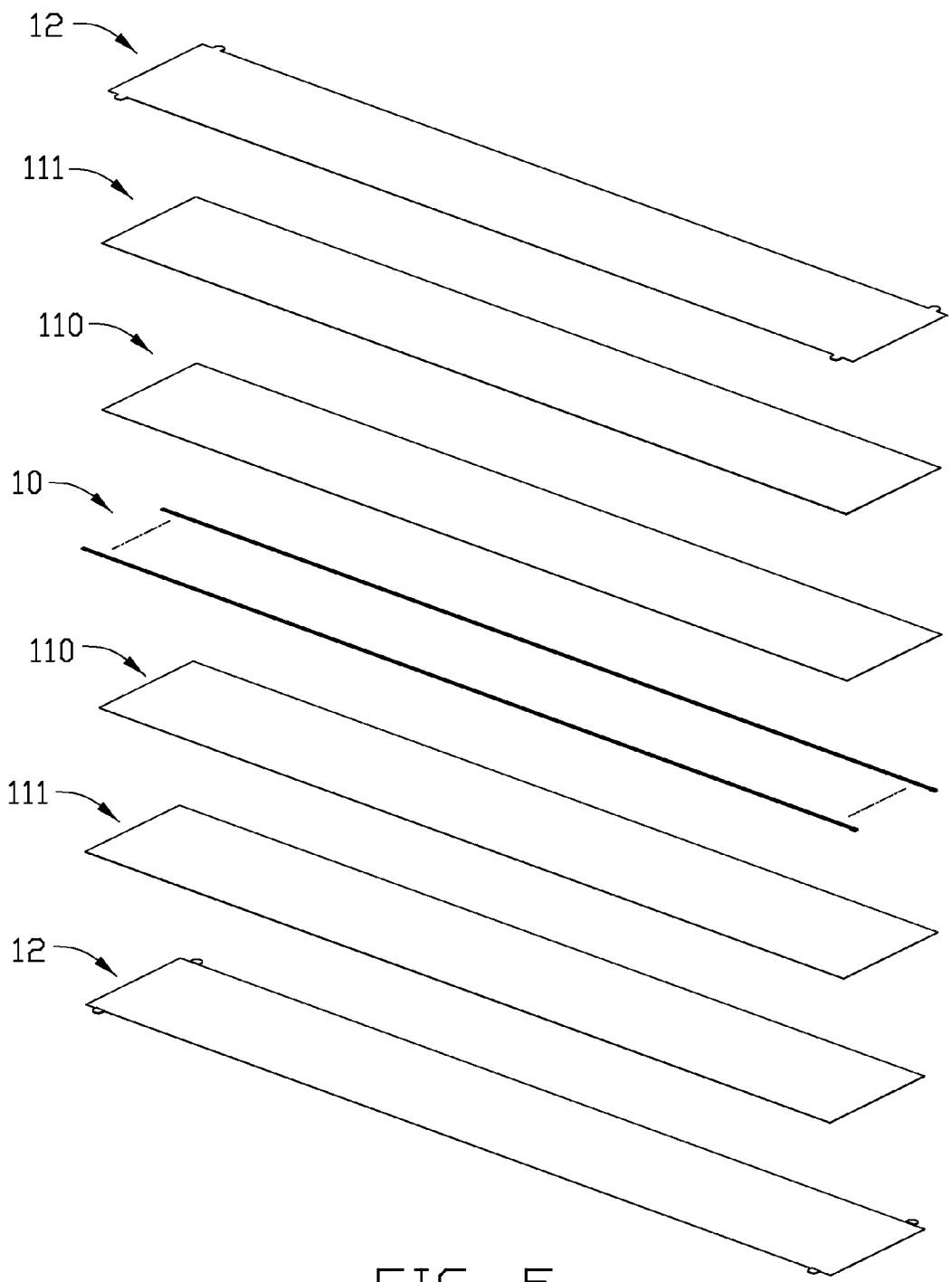
FIG. 5 is an exploded, perspective view of the flat cable of the flat cable assembly in according to the present invention.

Referring to FIG. 1, a flat cable assembly 100 according to the present invention comprises a flat cable 1, a PCB 2 electrically connected to the flat cable 1 and a retainer 3 covering to a joint of the flat cable 1 and the PCB 2. The retainer 3 is a hot melt adhesive fixing the flat cable 1 to the PCB 2.

Referring to FIGS. 2 to 5, in the preferred embodiment according to the present invention, the flat cable 1 is a flexible flat cable, and it comprises a number of conductors 10 paralleled and spaced apart with each other, an insulator 11 enclosing the number of conductors 10 and a metallic shielding layer 12 enclosing the insulator 11. The insulator 11 includes a first insulating layer 110 enclosing the number of conductors 10 and a second insulating layer 111 sandwiched between the first insulating layer 110 and the metallic shielding layer 12. The second insulating layer 111 has a thickness which can be increased or decreased to adjust the characteristic impedance of the flat cable 1 to meet impedance matching. The number of conductors 10 have a mating end exposed out of the insulator 11 and welded to the PCB 2. The metallic shielding layer 12 defines two extension portions 120 formed at two sides thereof.

The PCB 2 defines a plurality of conductive pads 20 formed on a top surface of the PCB 2 for welding to the corresponding conductors 10 and two grounding conductive pads 21 formed on two lateral sides of the plurality of conductive pads 20. The flat cable 1 is completely welded to the PCB 2 by several assembling steps. Firstly the two extension portions 120 of the metallic shielding layer 12 are respectively welded to the two grounding conductive pads 21. And then the number of conductors 10 are welded to the corresponding conductive pads 20 of the PCB 2. Finally, the hot melt adhesive is covered to the joint of the conductors 10 and the conductive pads 20 and the joint of the two extension portions 120 and the grounding conductive pads 21. Thus, the flat cable 1 is reliable fixed on the PCB 2 via the hot melt adhesive.

In the preferred embodiment according to the present invention, the PCB 2 defines two grounding conductive pads 21 for electrically connected to the two extension portions 120 to improve the anti-electromagnetic interference ability of the flat cable assembly 100. And before the number of conductors 10 are welded to the corresponding conductive pads of the PCB 2, the two extension portions 120 are welded to the grounding conductive pads 21 in advance to achieve a preliminary position between the flat cable 1 and the PCB 2 and preventing the conductors 10 from breaking off when the flat cable 1 is bent before the hot melt adhesive formed on the joint of the conductors 10 and the conductive pads 20. In other embodiments, the flat cable could be a high frequency flat cable with circular conductors formed therein or other types of flat cable.

What is claimed is:

1. A flat cable assembly comprising:
a flat cable;
a PCB (Printed Circuit Board) electrically connected to the flat cable; and
a retainer formed on and protectively cover a joint of the flat cable and the PCB;
wherein the flat cable defines a metallic shielding layer having two opposite extension portions respectively formed at two opposite sides of the flat cable, and the PCB defines grounding conductive pads electrically connected to the corresponding extension portions; wherein said extension portions are unitarily formed with the metallic shielding layer, and laterally and outwardly protrude beyond corresponding lateral side edges of the metallic shielding layer in a coplanar manner; wherein said retainer downwardly covers said two extension portions.

2. The flat cable assembly as claimed in claim 1, wherein the flat cable is a flexible flat cable.

3. The flat cable assembly as claimed in claim 1, wherein the flexible flat cable comprises a number of conductors spaced apart with each other and an insulator enclosing the number of conductors and a metallic shielding layer enclosing the insulator.

4. The flat cable assembly as claimed in claim 3, wherein a mating end of the number of conductors is exposed out of the insulator and welded to the PCB.

5. The flat cable assembly as claimed in claim 3, wherein the insulator includes a first insulating layer enclosing the conductors and a second insulating layer sandwiched between the first insulating layer and the metallic shielding layer.

6. The flat cable assembly as claimed in claim 1, wherein the retainer is a hot melt adhesive.

7. The flat cable assembly as claimed in claim 1, wherein one side of the flat cable is put on the PCB and welded to the PCB, the joint of the flat cable and the PCB is covered by the retainer.

8. A flat cable assembly comprising:
a printed circuit board having conductive pads in one row and a pair of grounding pads located by two sides of the conductive pads in a transverse direction; and
a flat cable positioned upon the printed circuit board and including a plurality of conductors which are sandwiched between a pair of insulative layers and have exposed front portions soldered to the corresponding conductive pads, respectively, and a pair of extensions soldered upon the grounding pads; wherein
said pair of extensions protrude laterally beyond corresponding lateral side edges of the flat cable in a coplanar manner; wherein
the flat cable includes at least one metallic shielding layer on which the extensions are located;
further including a retaining bar secured upon the printed circuit board to cover at least said exposed front portions of the conductors and the corresponding conductive pads; wherein
said retaining bar further downwardly covers the pair of extensions and the corresponding grounding pads, and front regions of the pair of insulative layers.

9. The flat cable assembly as claimed in claim 8, wherein said retaining bar is essentially a melted adhesive.

10. The flat cable assembly as claimed in claim 8, wherein the flat cable further includes a pair of metallic shielding layers are applied upon exterior surfaces of the pair of insulative layers, respectively.

11. The flat cable assembly as claimed in claim 10, further including a pair of secondary insulative layers each sandwiched between the metallic shielding layer and the corresponding insulative layer for impedance adjustment.

12. The flat cable assembly as claimed in claim 8, wherein said pair of grounding pads are offset from the conductive pads in a front-to-back direction perpendicular to said transverse direction.

13. The method of assembling the flat cable assembly as claimed in claim 1 comprising the following steps:
firstly, soldering the extension portions of the metal shield layer to the grounding conductive pads of the PCB;
secondly, soldering a number of conductors of the flat cable to the PCB;
thirdly, positioning the hot melt adhesive upon the joint of the conductors and conductive pads and the joint of the extension portions and the grounding conductive pads of the PCB to fix the flat cable upon the PCB via solidification.

\* \* \* \* \*